(12) United States Patent
Kim et al.

(10) Patent No.: US 11,790,985 B2
(45) Date of Patent: Oct. 17, 2023

(54) ELECTRONIC DEVICE FOR CONFIGURING NEURAL NETWORK

(71) Applicant: SAMSUNG ELECTRONICS CO., LTD., Suwon-si (KR)

(72) Inventors: Jinseok Kim, Incheon (KR); Yulhwa Kim, Daegu (KR); Jae-Joon Kim, Pohang-si (KR); Hyungjun Kim, Pohang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/723,358

(22) Filed: Apr. 18, 2022

(65) Prior Publication Data
US 2022/0246204 A1 Aug. 4, 2022

Related U.S. Application Data

(63) Continuation of application No. 17/011,929, filed on Sep. 3, 2020, now Pat. No. 11,335,399.

(30) Foreign Application Priority Data

Sep. 6, 2019 (KR) .................. 10-2019-0110691

(51) Int. Cl.
*G11C 11/412* (2006.01)
*G11C 11/418* (2006.01)
(Continued)

(52) U.S. Cl.
CPC .............. *G11C 11/412* (2013.01); *G06N 3/08* (2013.01); *G11C 11/418* (2013.01); *G11C 11/419* (2013.01)

(58) Field of Classification Search
CPC ... G11C 11/412; G11C 11/418; G11C 11/419; G11C 7/12; G11C 7/062; G11C 7/1006;
(Continued)

(56) References Cited

U.S. PATENT DOCUMENTS 9,704,571 B2 7/2017 Kim et al.
10,269,415 B2 4/2019 Liaw
(Continued)

FOREIGN PATENT DOCUMENTS

KR 2017-0019227 A 2/2017
KR 2017-0045716 A 4/2017
(Continued)

OTHER PUBLICATIONS

J. Kim et al., "Area-Efficient and Variation-Tolerant In-Memory BNN Computing using 6T SRAM Array," 2019 Symposium on VLSI Circuits, Kyoto, Japan, 2019, pp. C118-C119, doi: 10.23919/VLSIC.2019.8778160.
(Continued)

*Primary Examiner* — Ajay Ojha
(74) *Attorney, Agent, or Firm* — NSIP Law (57) ABSTRACT

Disclosed are a first memory cell, a second memory cell, and an amplification circuit. The first memory cell outputs a first voltage through a first bit line or a second voltage through a second bit line, based on first input data received through a first word line and a second word line and a first weight. The second memory cell outputs a third voltage through the first bit line or a fourth voltage through the second bit line, based on second input data received through a third word line and a fourth word line and a second weight. The amplification circuit generates an output voltage having a level corresponding to a sum of a level of a voltage received through the first bit line and a level of a voltage received through the second bit line.

13 Claims, 10 Drawing Sheets

(51) Int. Cl.
 *G11C 11/419* (2006.01)
 *G06N 3/08* (2023.01)
(58) Field of Classification Search
 CPC ........ G11C 11/413; G06N 3/08; G06N 3/063;
  G06N 3/0895; G06N 3/09; G06N 3/091;
  G06N 3/092; G06N 3/094; G06N 3/096;
  G06N 3/098; G06N 3/0985
 See application file for complete search history.

(56) References Cited

U.S. PATENT DOCUMENTS

| | | | |
|---|---|---|---|
| 10,497,460 | B2 | 12/2019 | Kim et al. |
| 11,126,402 | B2 | 9/2021 | Li |
| 2018/0144240 | A1 | 5/2018 | Garbin |
| 2019/0102359 | A1 | 4/2019 | Knag |
| 2019/0164046 | A1 | 5/2019 | Song |
| 2019/0244087 | A1 | 8/2019 | Park et al. |

FOREIGN PATENT DOCUMENTS

| | | |
|---|---|---|
| KR | 2019-0035237 A | 4/2019 |
| KR | 2019-0094679 A | 8/2019 |

OTHER PUBLICATIONS

H. Valavi, P. J. Ramadge, E. Nestler and N. Verma, "A Mixed-Signal Binarized Convolutional-Neural-Network Accelerator Integrating Dense Weight Storage and Multiplication for Reduced Data Movement," 2018 IEEE Symposium on VLSI Circuits, Honolulu, HI, 2018, pp. 141-142, doi: 10.1109/VLSIC.2018.8502421.

S. Yin, et al., "XNOR-SRAM: In-Memory Computing SRAM Macro for Binary/Ternary Deep Neural Networks," IEEE Journal of Solid-State Circuits, vol. 55, No. 6, Jun. 2020, pp. 1733-1743.

R. Liu et al., "Parallelizing SRAM Arrays with Customized Bit-Cell for Binary Neural Networks," 2018 55th ACM/ESDA/IEEE Design Automation Conference (DAC), San Francisco, CA, 2018, pp. 1-6, doi: 10.1109/DAC.2018.8465935.

ELECTRONIC DEVICE FOR CONFIGURING NEURAL NETWORK

CROSS-REFERENCE TO RELATED APPLICATIONS

This application is a continuation of application Ser. No. 17/011,929, filed on Sep. 3, 2020, which claims priority under 35 U.S.C. § 119 to Korean Patent Application No. 10-2019-0110691 filed on Sep. 6, 2019, in the Korean Intellectual Property Office, the disclosure of each of which is incorporated by reference herein in its entirety.

BACKGROUND

Embodiments of the inventive concept described herein relate to an electronic device, and more particularly, relate to an electronic device for implementing or configuring a neural network.

A neural network means an algorithm for modeling the human brain and an electronic circuit/device/system for implementing the algorithm. The neural network includes a large number of neurons as a basic unit, and the neurons transfer signals to other neurons through synapses.

The neural network is used to perform machine learning. The neural network may be trained based on input data. For example, the neural network may learn a feature and a pattern of the input data. The neural network may generate an answer to a newly input question based on the performed training. For example, the neural network may generate output data corresponding to the input data.

There is a need to process a large amount of data to perform the algorithm for the machine learning. Accordingly, a design for the neural network for efficiently processing a large amount of data is required. For example, a binary neural network (BNN) to process data based on binary numbers may be designed.

SUMMARY

Embodiments of the inventive concept provide an electronic device for configuring a binary neural network (BNN).

According to an exemplary embodiment, an electronic device may include a first memory cell, a second memory cell, and an amplification circuit. The first memory cell may output a first voltage through a first bit line or a second voltage through a second bit line, based on first input data received through a first word line and a second word line and a first weight. The second memory cell may output a third voltage through the first bit line or a fourth voltage through the second bit line, based on second input data received through a third word line and a fourth word line and a second weight. The amplification circuit may generate an output voltage having a level corresponding to a sum of a level of a voltage received through the first bit line and a level of a voltage received through the second bit line.

According to an exemplary embodiment, an electronic device may include a first column and an amplification circuit. The first column may include a first memory cell that outputs first result data of a logical value determined according to a logical operation through a first bit line or a second bit line, based on first input data input through a first word line and a first weight. The first column may include a second memory cell that outputs second result data of a logical value determined according to the logical operation through the first bit line or the second bit line, based on second input data input through a second word line and a second weight. The amplification circuit may output a sum of the first result data and the second result data.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept may be described in detail and clearly to such an extent that an ordinary one in the art easily implements the inventive concept.

Figure 1:
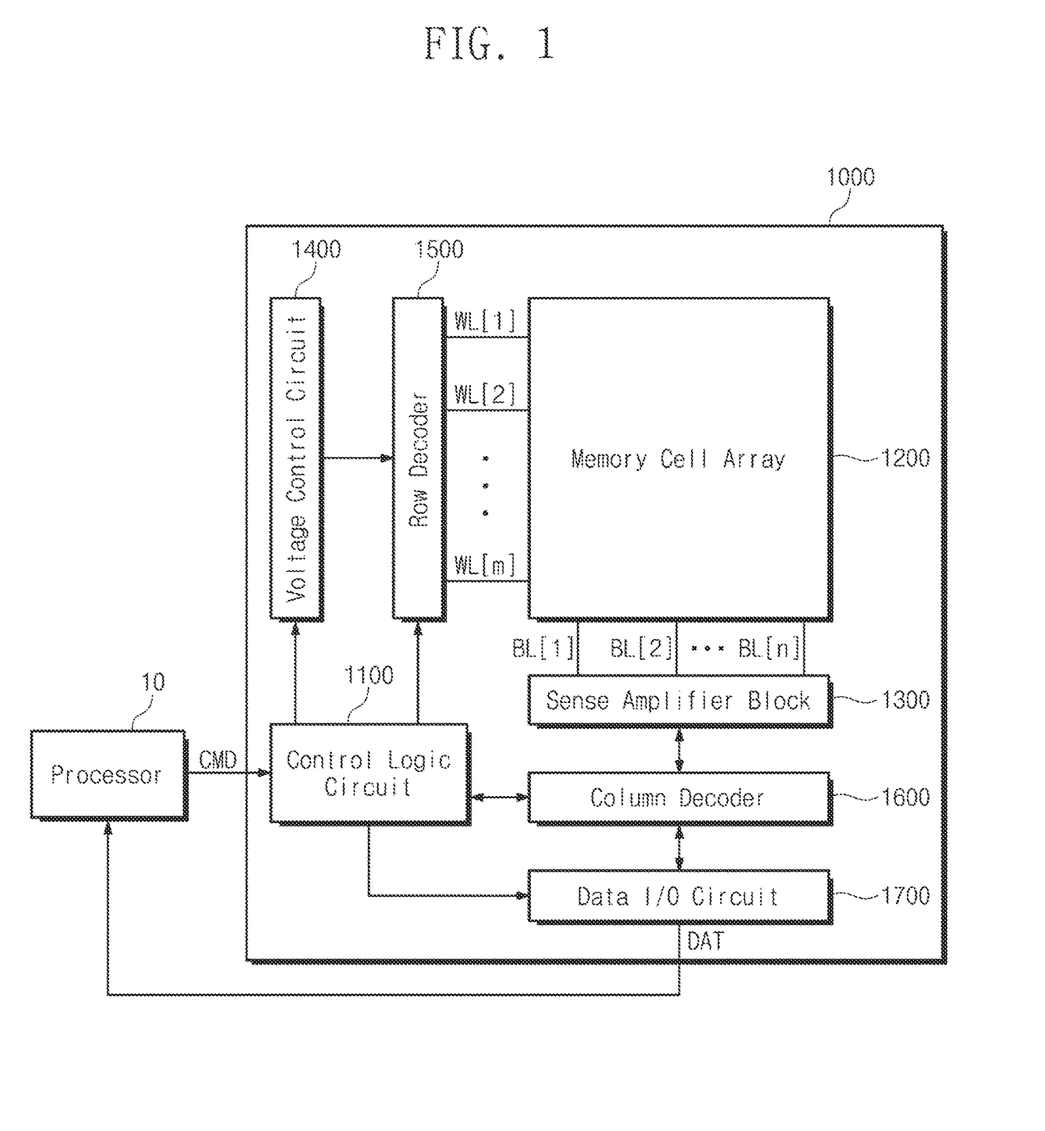
FIG. 1 is a block diagram illustrating an electronic device according to an embodiment of the inventive concept.

FIG. 1 is a block diagram illustrating an electronic device according to an embodiment of the inventive concept.

Referring to FIG. 1, an electronic device 1000 may include a control logic circuit 1100, a memory cell array 1200, a sense amplifier block 1300, a voltage control circuit 1400, a row decoder 1500, a column decoder 1600, and a data input/output circuit 1700. For example, the electronic device 1000 may be a memory device configured to implement a neural network. Below, in the specification, the electronic device 1000 implemented with a static random access memory (SRAM) will be described, but it may be understood that the electronic device 1000 is capable of being implemented by using various types of memories.

The control logic circuit 1100 may control components of the electronic device 1000 in response to a command CMD from a processor 10. For example, the control logic circuit 1100 may control the components of the electronic device 1000 in response to the command CMD from the processor 10 such that various operations (e.g., a read operation and a write operation) are performed. The control logic circuit 1100 may control the voltage control circuit 1400 in response to the command CMD from the processor 10 such that voltages are applied to word lines WL[1] to WL[m] through the row decoder 1500.

The control logic circuit 1100 may control the voltage control circuit 1400 based on the command CMD from the processor 10 for the purpose of inputting data in the memory cell array 1200. The word lines WL[1] to WL[m] may be activated or deactivated by the voltages applied by the voltage control circuit 1400. For example, to activate a word line may correspond to input data having logical value "1", and to deactivate a word line may correspond to input data having logical value "−1".

The voltage control circuit 1400 may be configured to control voltages to be provided to the word lines WL[1] to WL[m] connected with the memory cell array 1200. For example, under control of the control logic circuit 1100, the voltage control circuit 1400 may generate voltages (i.e., voltages for inputting data of logical value "1") for activating memory cells of the memory cell array 1200 and voltages (i.e., voltages for inputting data of logical value "−1") for deactivating the memory cells.

The memory cell array 1200 may include memory cells for storing data. For example, each of the memory cells of the memory cell array 1200 may store a weight. The memory cells may be connected with the word lines WL[1] to WL[m] and bit lines BL[1] to BL[n]. The word lines WL[1] to WL[m] may be connected with the row decoder 1500, and bit lines BL[1] to BL[n] may be connected with the column decoder 1600.

The sense amplifier block 1300 may receive voltages indicating data through the bit lines BL[1] to BL[n]. The sense amplifier block 1300 may generate one output voltage based on the voltages received from the bit lines BL[1] to BL[n] and may amplify the generated output voltage. An exemplary configuration and exemplary operations of the sense amplifier block 1300 will be described with reference to FIGS. 8 and 9.

The data I/O circuit 1700 may be connected with the column decoder 1600 and may temporarily store data to be stored in the memory cell array 1200 or data provided from the processor 10. The data I/O circuit 1700 may exchange data DAT with the processor 10.

For example, the processor 10 may generate data associated with weights for the purpose of performing training on the electronic device 1000 for implementing a neural network system. The processor 10 may output a command CMD for the purpose of storing the weights in the memory cell array 1200. The control logic circuit 1100 may control the voltage control circuit 1400 in response to the command CMD such that voltages corresponding to a weight are applied through the word lines WL[1] to WL[m]. The memory cell array 1200 may store weights through a training operation.

Afterwards, the processor 10 may output the command CMD for the purpose of obtaining output data corresponding to specific data (e.g., data associated with a question input from a user). To input data in the memory cell array 1200 in response to the command CMD, the control logic circuit 1100 may control the voltage control circuit 1400 such that a plurality of word lines are activated. Voltages corresponding to data to be input through the plurality of word lines (e.g., the word lines WL[1] to WL[m]) may be applied by the voltage control circuit 1400.

Figure 2:
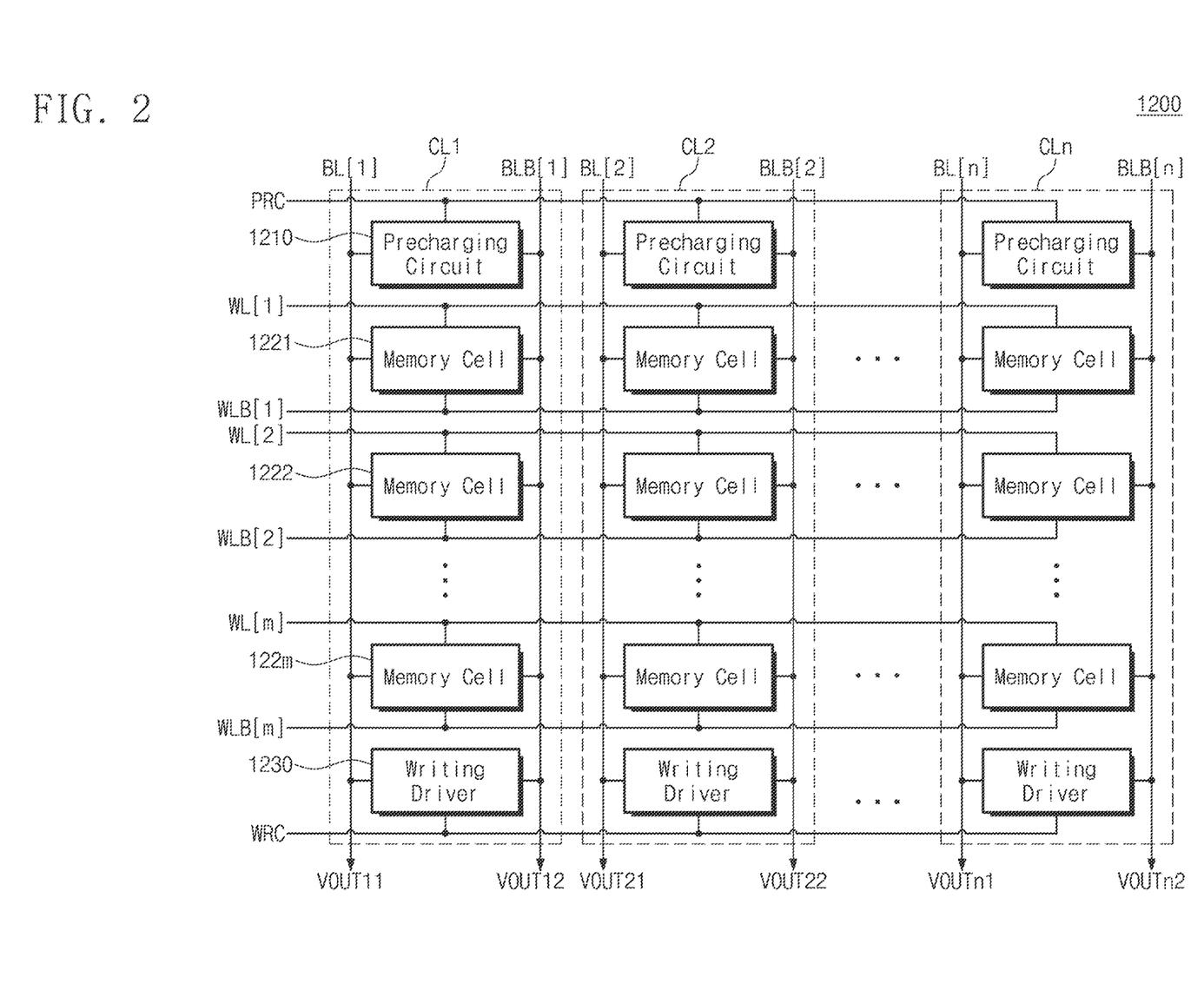
FIG. 2 is a block diagram illustrating an exemplary configuration of a memory cell array of FIG. 1.

Only the word lines WL[1] to WL[m] and the bit lines BL[1] to BL[n] are described in the example of FIG. 1, but it may be understood that different word lines respectively corresponding to the word lines WL[1] to WL[m] are connected between the row decoder 1500 and the memory cell array 1200 and different bit lines respectively corresponding to the bit lines BL[1] to BL[n] are connected between the memory cell array 1200 and the column decoder 1600 (e.g., refer to word lines WLB[1] to WLB[m] and bit lines BLB[1] to BLB[n] to be described with reference to FIG. 2).

FIG. 2 is a block diagram illustrating an exemplary configuration of a memory cell array of FIG. 1.

Referring to FIG. 2, the memory cell array 1200 may include "n" columns CL1 to CLn (n being any natural number) including memory cells. Each of the columns CL1 to CLn may include a precharging circuit, "m" memory cells, and a writing driver. For example, the column CL1 may include a precharging circuit 1210, memory cells 1221 to 122m, and a writing driver 1230.

The precharging circuits 1210 may receive a precharging voltage from the row decoder 1500 through a precharging line PRC. A first memory cell of each of the columns CL1 to CLn may be connected with the word lines WL[1] and WLB[1]. As in the above description, a k-th memory cell of each of the columns CL1 to CLn may be connected with the word lines WL[k] and WLB[k] (k being a natural number between 2 and m). The writing driver 1230 of each of the columns CL1 to CLn may receive a write driving voltage from the row decoder 1500 through a writing driver line WRC.

The memory cells may receive data of logical value "1" or logical value "−1" through the word lines WL[1] to WL[m] and WLB[1] to WLB[m]. Each of the memory cells may store a weight of logical value "1" or logical value "−1" through the training. The memory cells may output data of logical value "1" or logical value "−1" through the bit lines BL[1] to BL[n] and BLB[1] to BLB[n] based on the input data and the weights. For example, the memory cells may output voltages VOUT11 to VOUTn1 and VOUT12 to VOUTn2 each indicating data of logical value "1" or logical value "−1" through the bit lines BL[1] to BL[n] and BLB[1] to BLB[n].

A memory cell 1221 may receive data from one of the word lines WL[1] and WLB[1]. For example, the memory cell 1221 may receive data of logical value "1" through the word line WL[1] or may receive data of logical value "−1" through the word line WLB[1]. The memory cell 1221 may output data through the bit line BL[1] in response to data received through the word line WL[1] and may output data through the bit line BLB[1] in response to data received through the word line WLB[1].

To obtain data output from memory cells 1221 to 122m during one period, voltages may be received through the word lines WL[1] to WL[m] and WLB[1] to WLB[m] during one period. For example, as voltages are substantially simultaneously received through the word lines WL[1] to WL[m] and WLB[1] to WLB[m], data may be substantially simultaneously output from the memory cells 1221 to 122m of the column CL1. Accordingly, the voltages VOUT11 and VOUT12 each indicating a sum of data output from the memory cells 1221 to 122m may be output through the bit lines BL[1] and BLB[1], respectively.

Operations of memory cells in the columns CL2 to CLn are similar to the operations of the memory cells 1221 to 122m, and thus, additional description will be omitted to avoid redundancy. An exemplary configuration of the memory cell 1221 will be more fully described with reference to FIG. 3. Structures of the memory cells of FIG. 2 are similar to a structure of the memory cell 1221, and thus, additional description will be omitted to avoid redundancy.

Figure 3:
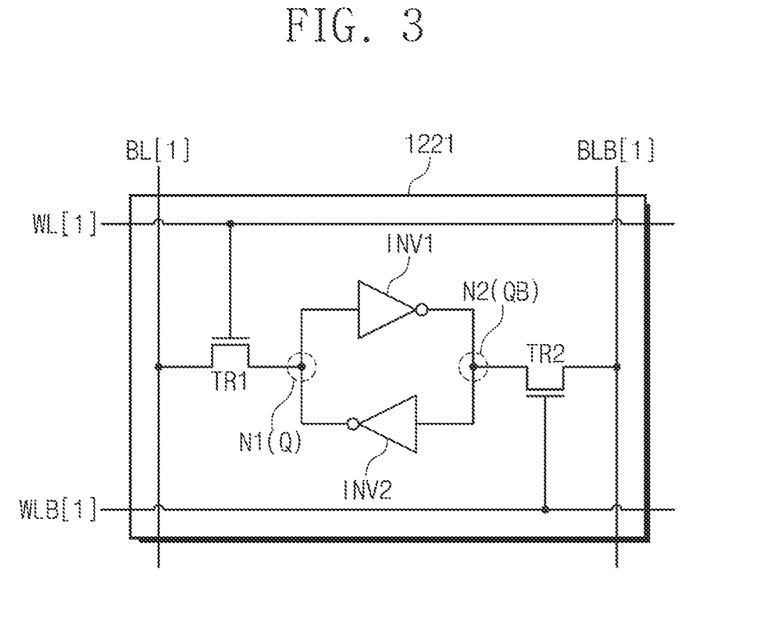
FIG. 3 is a block diagram illustrating an exemplary configuration of a memory cell of FIG. 2.

FIG. 3 is a block diagram illustrating an exemplary configuration of a memory cell of FIG. 2.

Referring to FIG. 3, the memory cell 1221 may include transistors TR1 and TR2 and inverters INV1 and INV2. Each of the inverters INV1 and INV2 may include at least one transistor. For example, each of the inverters INV1 and INV2 may be implemented with two transistors, and the memory cell 1221 may be implemented with a total of six transistors. However, it may be understood that the memory cell 1221 is capable of being changed/modified to have various cell structures to perform operations to be described with reference to FIGS. 4 to 7.

In the example of FIG. 3, each of the transistors TR1 and TR2 may include an N-type metal oxide semiconductor field effect transistor (NMOSFET). However, it may be understood that each of the transistors TR1 and TR2 is capable of being implemented with at least one of various transistors configured to perform operations to be described with reference to FIGS. 4 to 7 or with one of combinations of components different from the transistors.

A gate terminal of the transistor TR1 may receive data having a specific logical value through the word line WL[1]. The transistor TR1 may be connected between the bit line BL[1] and a node N1. The transistor TR1 may be configured to transfer data "Q" of the node N1 to the bit line BL[1].

A gate terminal of the transistor TR2 may receive data having a specific logical value through the word line WLB[1]. The transistor TR2 may be connected between the bit line BLB[1] and a node N2. The transistor TR2 may be configured to transfer data QB of the node N2 to the bit line BLB[1].

The inverters INV1 and INV2 may be configured to latch data on the nodes N1 and N2. The inverters INV1 and INV2 may be connected between the node N1 and the node N2. The inverter INV1 may invert a logical value of the data "Q" on the node N1 to form the data QB on the node N2. The inverter INV2 may invert a logical value of the data QB on the node N2 to form the data "Q" on the node N1.

Accordingly, the data "Q" may be latched at the node N1, and the data QB may be latched at the node N2. A logical value of the data "Q" and a logical value of the data QB may be complementary. The memory cell 1221 may store a weight through a latch operation of the inverters INV1 and INV2. For example, the memory cell 1221 may store a weight as a logical value of the data "Q" and a logical value complementary to the logical value of the data "Q".

Each of the transistors TR1 and TR2 may be configured to operate as a switch. For example, the transistor TR1 may be turned on in response to a specific logical value of a voltage received through the word line WL[1] and may control a connection between the node N1 and the bit line BL[1]. The transistor TR2 may be turned on in response to a specific logical value of a voltage received through the word line WLB[1] and may control a connection between the node N2 and the bit line BLB[1].

A logical value of data received through the word line WL[1] and a logical value of data received through the word line WLB[1] may be complementary. Because data received through the word line WL[1] are complementary to data received through the word line WLB[1], one of the transistors TR1 and TR2 may be turned on, and the other thereof may be turned off.

When the transistor TR1 is turned on and the transistor TR2 is turned off, a current may flow from the node N1 to the bit line BL[1], and the data "Q" latched at the node N1 may be output through the bit line BL[1]. When the transistor TR2 is turned on and the transistor TR1 is turned off, a current may flow from the node N2 to the bit line BLB[1], and the data QB latched at the node N2 may be output through the bit line BLB[1].

Below, exemplary operations of the memory cell 1221 will be more fully described with reference to FIGS. 4 to 7. Operations of the remaining memory cells other than the memory cell 1221 are similar to the operations of the memory cell 1221 described with reference to FIG. 2, and thus, additional description will be omitted to avoid redundancy.

Figure 4:
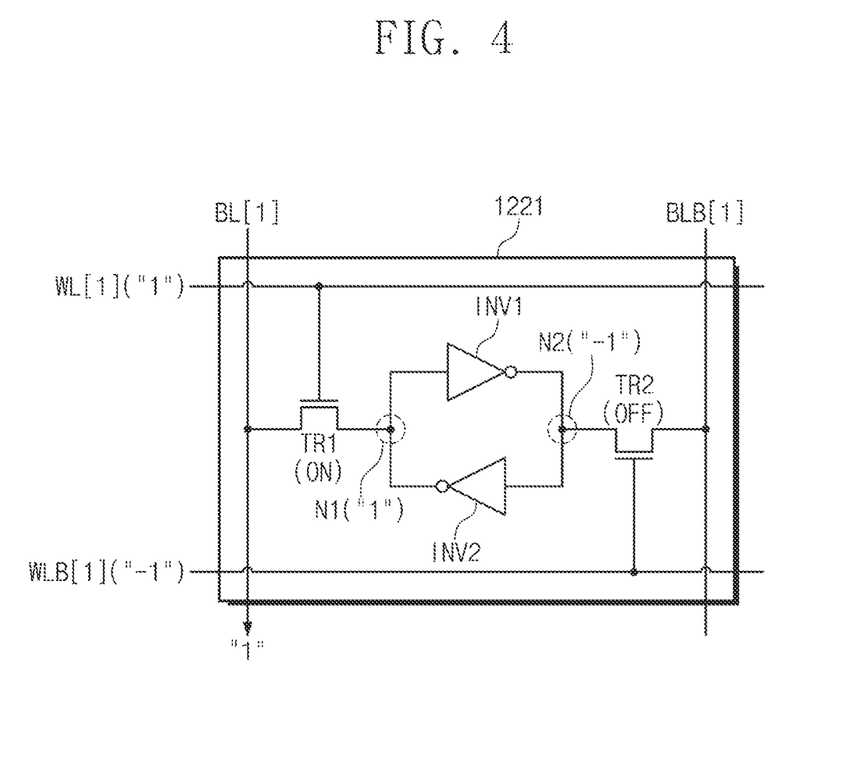
FIGS. 4 to 7 are block diagrams for describing exemplary operations of a memory cell of FIG. 2.

FIG. 4 is a block diagram for describing exemplary operations of a memory cell of FIG. 2.

In the example of FIG. 4, data of logical value "1" may be input to the memory cell 1221. To input the data of logical value "1" to the memory cell 1221, the voltage control circuit 1400 of FIG. 1 may respectively apply voltages to the word lines WL[1] and WLB[1] through the row decoder 1500. For example, the voltage control circuit 1400 may apply a voltage corresponding to logical value "1" through the word line WL[1] and may apply a voltage corresponding to logical value "−1" through the word line WLB[1].

For example, the voltage corresponding to logical value "1" may be an operating voltage having a positive level, and the voltage corresponding to logical value "−1" may be a ground voltage. However, the inventive concept is not limited thereto. For example, a designer of the electronic device 1000 may set levels of voltages to be applied through the word lines WL[1] and WLB[1] in consideration of threshold voltages of the transistors TR1 and TR2 and the like.

As described with reference to FIG. 1, the memory cell 1221 may store a weight as a logical value of the data "Q" through a training operation. For example, through a training operation based on a BNN algorithm, the memory cell 1221 may store a weight of "1" or "−1". For example, the memory cell 1221 may store a weight of "1" as logical value "1" of the data "Q" and logical value "−1" of the data QB.

To store data of logical value "1", the voltage corresponding to logical value "1" may be applied to the gate terminal of the transistor TR1 through the word line WL[1], and the voltage corresponding to logical value "−1" may be applied to the gate terminal of the transistor TR2 through the word line WLB[1].

The transistor TR1 may be turned on by the voltage of the word line WL[1], and the transistor TR2 may be turned off by the voltage of the word line WLB[1]. Accordingly, data of logical value "1" latched at the node N1 may be output to the bit line BL[1] through the transistor TR1. That is, the memory cell 1221 may output data of logical value "1" through the bit line BL[1], based on the input data of logical value "1" and the stored weight of "1".

Figure 5:
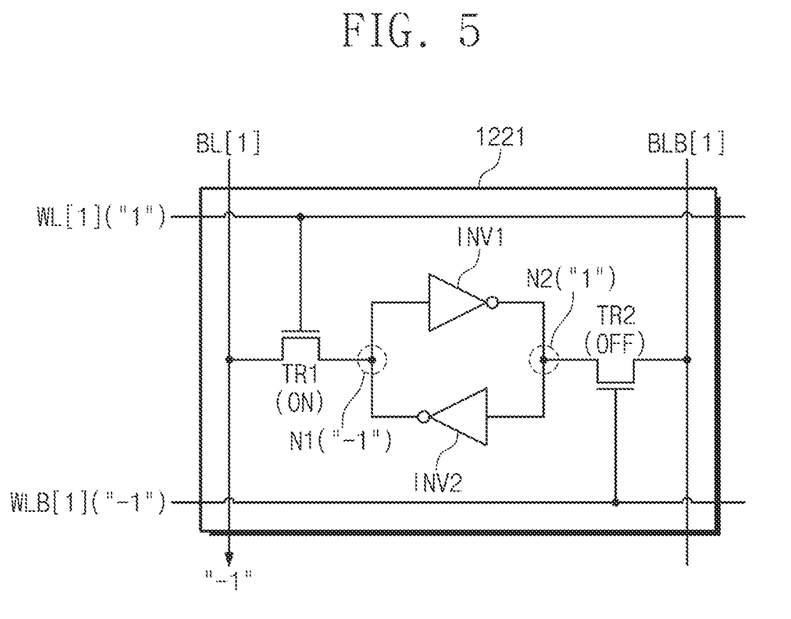

FIG. 5 is a block diagram for describing exemplary operations of a memory cell of FIG. 2.

In the example of FIG. 5, data of logical value "1" may be input to the memory cell 1221. To input the data of logical value "1" to the memory cell 1221, the voltage control circuit 1400 of FIG. 1 may respectively apply voltages to the word lines WL[1] and WLB[1] through the row decoder 1500. For example, the voltage control circuit 1400 may apply the voltage corresponding to logical value "1" through the word line WL[1] and may apply the voltage corresponding to logical value "−1" through the word line WLB[1].

For example, the memory cell 1221 may store a weight of "−1" as logical value "−1" of the data "Q" and logical value "1" of the data QB. To store data of logical value "1", the voltage corresponding to logical value "1" may be applied to the gate terminal of the transistor TR1 through the word line WL[1], and the voltage corresponding to logical value "−1" may be applied to the gate terminal of the transistor TR2 through the word line WLB[1].

The transistor TR1 may be turned on by the voltage of the word line WL[1], and the transistor TR2 may be turned off by the voltage of the word line WLB[1]. Accordingly, data of logical value "−1" latched at the node N1 may be output to the bit line BL[1] through the transistor TR1. That is, the memory cell 1221 may output data of logical value "−1" through the bit line BL[1], based on the input data of logical value "1" and the stored weight of "−1".

Figure 6:
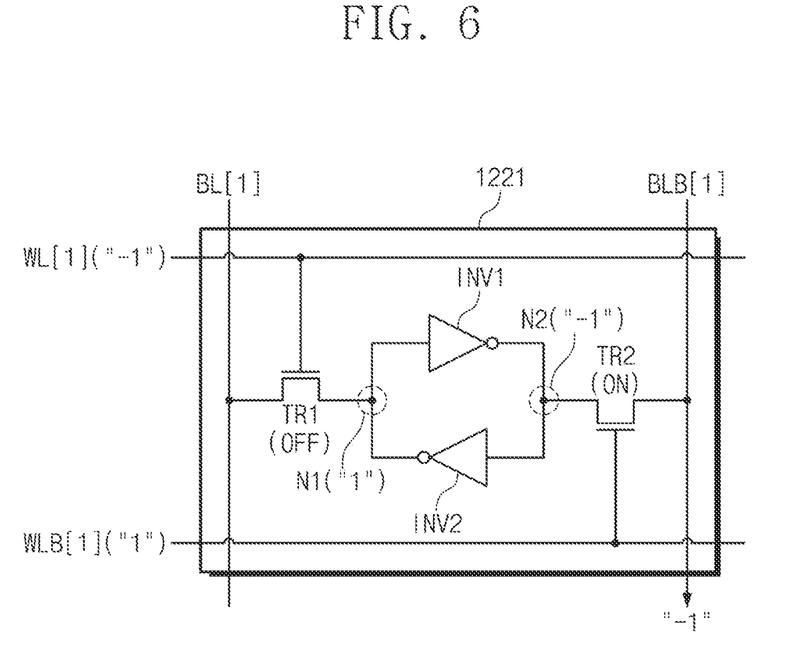

FIG. 6 is a block diagram for describing exemplary operations of a memory cell of FIG. 2.

In the example of FIG. 6, data of logical value "−1" may be input to the memory cell 1221. To input the data of logical value "−1" to the memory cell 1221, the voltage control circuit 1400 of FIG. 1 may respectively apply voltages to the word lines WL[1] and WLB[1] through the row decoder 1500. For example, the voltage control circuit 1400 may apply the voltage corresponding to logical value "−1" through the word line WL[1] and may apply the voltage corresponding to logical value "1" through the word line WLB[1].

For example, the memory cell 1221 may store a weight of "1" as logical value "1" of the data "Q" and logical value "−1" of the data QB. To store data of logical value "−1", the voltage corresponding to logical value "−1" may be applied to the gate terminal of the transistor TR1 through the word line WL[1], and the voltage corresponding to logical value "1" may be applied to the gate terminal of the transistor TR2 through the word line WLB[1].

The transistor TR1 may be turned off by the voltage of the word line WL[1], and the transistor TR2 may be turned on by the voltage of the word line WLB[1]. Accordingly, data of logical value "−1" latched at the node N2 may be output to the bit line BLB[1] through the transistor TR2. That is, the memory cell 1221 may output data of logical value "−1" through the bit line BLB[1], based on the input data of logical value "−1" and the stored weight of "1".

Figure 7:
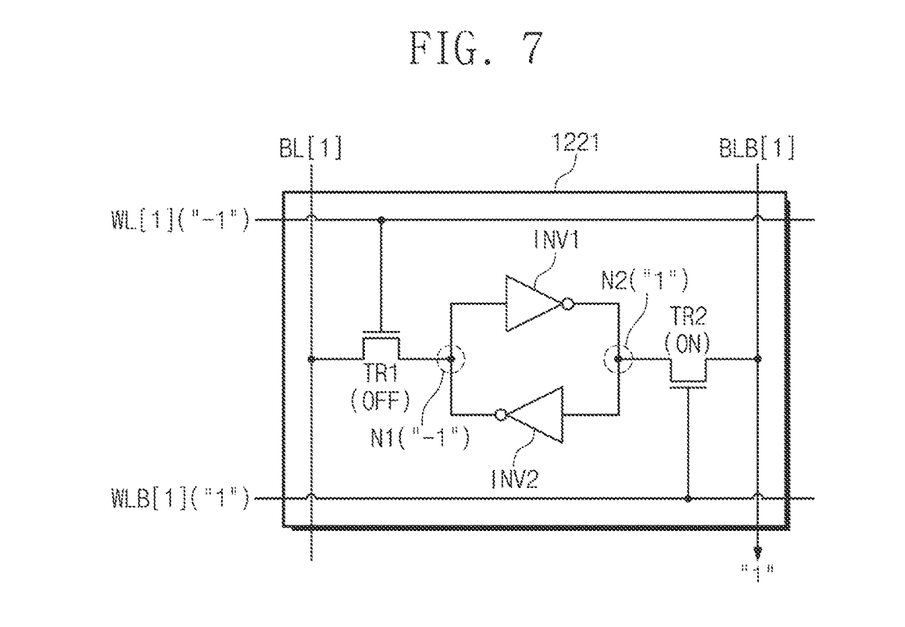

FIG. 7 is a block diagram for describing exemplary operations of a memory cell of FIG. 2.

In the example of FIG. 7, data of logical value "−1" may be input to the memory cell 1221. To input the data of logical value "−1" to the memory cell 1221, the voltage control circuit 1400 of FIG. 1 may respectively apply voltages to the word lines WL[1] and WLB[1] through the row decoder 1500. For example, the voltage control circuit 1400 may apply the voltage corresponding to logical value "−1" through the word line WL[1] and may apply the voltage corresponding to logical value "1" through the word line WLB[1].

For example, the memory cell 1221 may store a weight of "−1" as logical value "−1" of the data "Q" and logical value "1" of the data QB. To store data of logical value "−1", the voltage corresponding to logical value "−1" may be applied to the gate terminal of the transistor TR1 through the word line WL[1], and the voltage corresponding to logical value "1" may be applied to the gate terminal of the transistor TR2 through the word line WLB[1].

The transistor TR1 may be turned off by the voltage of the word line WL[1], and the transistor TR2 may be turned on by the voltage of the word line WLB[1]. Accordingly, data of logical value "1" latched at the node N2 may be output to the bit line BLB[1] through the transistor TR2. That is, the memory cell 1221 may output data of logical value "1" through the bit line BLB[1], based on the input data of logical value "−1" and the stored weight of "−1".

That is, referring to FIGS. 4 to 7, an XNOR operation may be performed based on a logical value of data input to the memory cell 1221 and a weight stored in the memory cell 1221. Table 1 below shows a truth table of an XNOR operation that is performed by the memory cell 1221.

TABLE 1

| IN | Q | OUT |
|----|----|-----|
| 1  | 1  | 1   |
| 1  | −1 | −1  |
| −1 | 1  | −1  |
| −1 | −1 | 1   |

In Table 1 above, "IN" indicates a logical value of data input to the memory cell 1221, "Q" indicates a logical value of data (i.e., a weight) stored in the memory cell 1221, and "OUT" indicates a logical value of data output from the memory cell 1221.

As described with reference to FIGS. 4 to 7, the XNOR operation may be efficiently performed only based on an operation of applying voltages to the word lines WL[1] and WLB[1] connected with the memory cell 1221. That is, a binary neural network system based on the XNOR operation may be efficiently implemented by the electronic device 1000.

Data of logical value "1" or "−1" output from the memory cell 1221 may be transferred as a current of a specific level and/or a voltage of a specific level. For example, each of the memory cells 1221 to 122m included in the column CL1 of FIG. 1 may output a current of a specific level and/or a voltage of a specific level (i.e., data having a specific logical value) through the operations described with reference to FIGS. 4 to 7, and the voltages VOUT11 and VOUT12 each corresponding to a sum of data output from the memory cells 1221 to 122m may be output through the bit lines BL[1] and BLB[1], respectively.

Exemplary operations for summing data output from memory cells included in one column and outputting a voltage indicating the summed data will be more fully described with reference to FIGS. 10 and 11.

Figure 8:
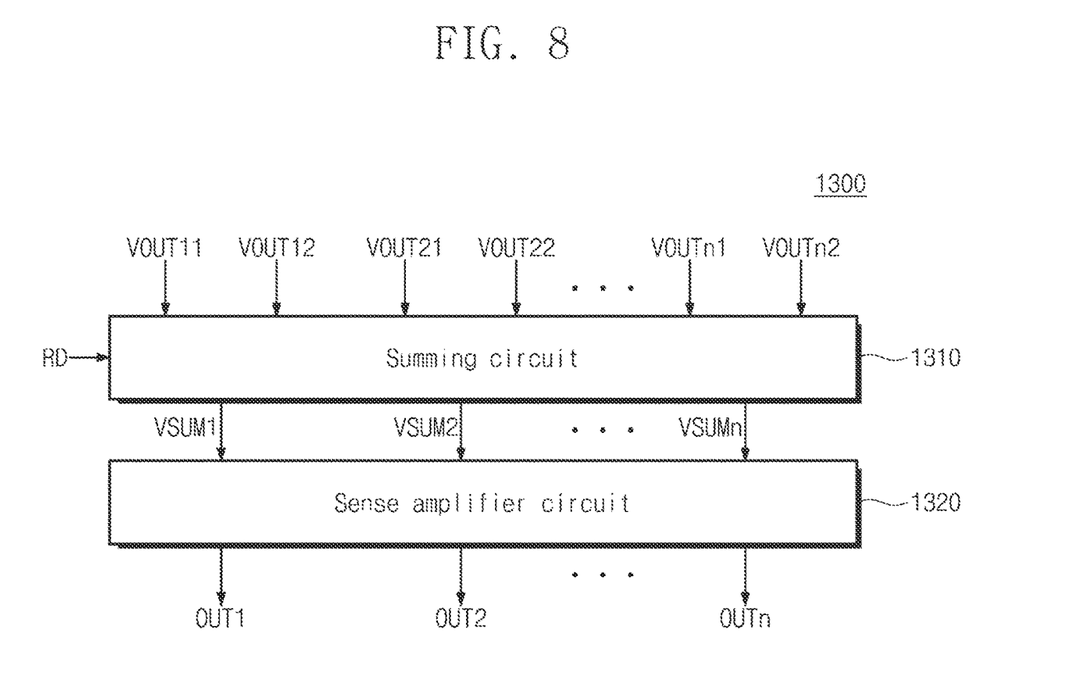
FIG. 8 is a block diagram illustrating an exemplary configuration of a sense amplifier block of FIG. 1.

FIG. 8 is a block diagram illustrating an exemplary configuration of a sense amplifier block of FIG. 1.

Referring to FIG. 8, the sense amplifier block 1300 may include a summing circuit 1310 and a sense amplifier circuit 1320. The summing circuit 1310 may receive voltages VOUT11 to VOUTn1 and VOUT12 to VOUTn2 from the bit lines BL[1] to BL[n] and BLB[1] to BLB[n].

The summing circuit 1310 may output voltages VSUM1 to VSUMn based on the voltages VOUT11 to VOUTn1 and VOUT12 to VOUTn2. For example, the summing circuit 1310 may output the voltage VSUM1 based on the voltages VOUT11 and VOUT12, may output the voltage VSUM2 based on the voltages VOUT21 and VOUT22, and may output the voltage VSUMn based on the voltages VOUTn1 and VOUTn2.

For example, a level of the voltage VSUM1 may correspond to a sum of levels of the voltages VOUT11 and VOUT12. As in the above description, a level of the voltage VSUM2 may correspond to a sum of levels of the voltages VOUT21 and VOUT22, and a level of the voltage VSUMn may correspond to a sum of levels of the voltages VOUTn1 and VOUTn2. An exemplary configuration and exemplary operations of the summing circuit 1310 will be more fully described with reference to FIG. 9.

Because levels of the voltages VOUT11 to VOUTn1 and VOUT12 to VOUTn2 respectively correspond to sums of data output from columns of the memory cell array 1200, levels of the voltages VSUM2 to VSUMn may also correspond to sums of data output from the columns of the memory cell array 1200, respectively.

The sense amplifier circuit 1320 may receive the voltages VSUM1 to VSUMn from the summing circuit 1310. The sense amplifier circuit 1320 may amplify levels of the voltages VSUM1 to VSUMn and may output signals OUT1 to OUTn indicating data of the voltages VSUM1 to VSUMn, respectively. An exemplary configuration and exemplary operations of the sense amplifier circuit 1320 will be more fully described with reference to FIG. 9.

Figure 9:
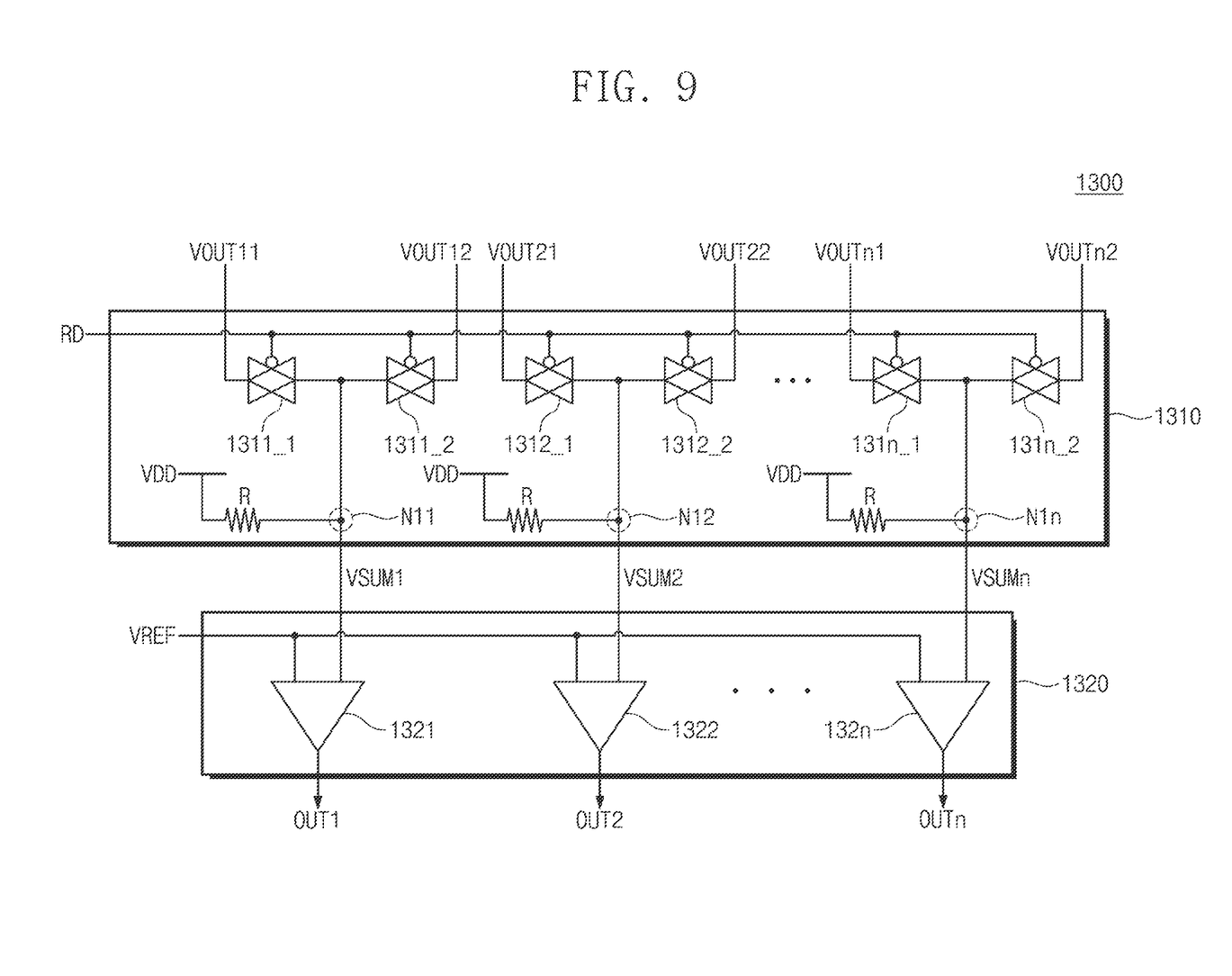
FIG. 9 is a circuit diagram illustrating an exemplary configuration of a sense amplifier block of FIG. 8.

FIG. 9 is a circuit diagram illustrating an exemplary configuration of a sense amplifier block of FIG. 8.

Referring to FIG. 9, the summing circuit 1310 may include transmission gates 1311_1 to 131n_1 and 1311_2 to 131n_2 and resistors "R". The sense amplifier circuit 1320 may include amplifiers 1321 to 132n.

Voltages output from bit lines connected with one column may be output to one node through two transmission gates. The transmission gates 1311_1 to 131n_1 and 1311_2 to 131n 2 may be connected with the amplifiers 1321 to 132n. For example, the transmission gates 1311_1 to 131n_1 and 1311_2 to 131n 2 may receive a read signal RD from the control logic circuit 1100. The transmission gates 1311_1 to 131n_1 and 1311_2 to 131n_2 may be turned on in response to the read signal RD and may transfer the voltages VOUT11 to VOUTn1 and VOUT12 to VOUTn2.

For example, the bit line BL[1] belonging to the column CL1 of FIG. 1 may be connected with a node N11 through the transmission gate 1311_1, and the bit line BLB[1] belonging to the column CL1 of FIG. 1 may be connected with the node N11 through the transmission gate 1311_2. The voltage VOUT11 may be transferred to the node N11 through the transmission gate 1311_1 turned on in response to the read signal RD. The voltage VOUT12 may be transferred to the node N11 through the transmission gate 1311_2 turned on in response to the read signal RD.

Accordingly, a level of the voltage VSUM1 formed on the node N11 may correspond to a sum of levels of the voltages VOUT11 and VOUT12. Because levels of the voltages VOUT11 and VOUT12 respectively correspond to sums of data output from the column CL1 through the bit lines BL[1] and BLB[1], a level of the voltage VSUM1 may correspond to a sum of data output from the column CL1.

As in the above description, the voltages VOUT21 and VOUT22 outputs from the column CL2 may be transferred to a node N12 through the transmission gates 1312_1 and 1312_2, and the voltages VOUTn1 and VOUTn2 outputs from the column CLn may be transferred to a node N1n through the transmission gates 131n_1 and 131n_2. Accordingly, additional description will be omitted to avoid redundancy. According to the above description, the levels of the voltages VSUM2 to VSUMn may respectively correspond to sums of data output from the columns CL2 to CLn.

The voltages VSUM1 to VSUMn may be output to the sense amplifier circuit 1320. Also, an operating voltage VDD may be applied to the nodes N11 to N1n through the resistors "R", respectively. For example, the operating voltage VDD may be received from an electronic circuit (e.g., a voltage generating circuit or a voltage regulator circuit) placed outside the sense amplifier block 1300. Voltages formed at the nodes N11 to N1n may be pulled up or pulled down by a current flowing from a supply terminal of the operating voltage VDD, which will be described with reference to FIG. 11.

The amplifiers 1321 to 132n of the sense amplifier circuit 1320 may receive a reference voltage VREF. For example, the reference voltage VREF that is a reference for comparison may have a characteristic insensitive to process-voltage-temperature (PVT) variations. For example, the amplifiers 1321 to 132n may receive the reference voltage VREF from a reference voltage generating circuit placed outside the sense amplifier block 1300. Also, the amplifiers 1321 to 132n may receive the reference voltage VREF from a specific column of the memory cell array 1200, which will be described with reference to FIG. 12.

The amplifiers 1321 to 132n of the sense amplifier circuit 1320 may receive the voltages VSUM1 to VSUMn from the summing circuit 1310. The amplifiers 1321 to 132n may operate based on results of comparing levels of the voltages VSUM1 to VSUMn with a level of the reference voltage VREF. The amplifiers 1321 to 132n may amplify differences between the levels of the voltages VSUM1 to VSUMn and the level of the reference voltage VREF to output the signals OUT1 to OUTn.

For example, when the level of the voltage VSUM1 is greater than the level of the reference voltage VREF, the amplifier 1321 may amplify the level of the voltage VSUM1 positively. Accordingly, the level of the voltage VSUM1 may increase. For example, when the level of the voltage VSUM1 is smaller than the level of the reference voltage VREF, the amplifier 1321 may amplify the level of the voltage VSUM1 negatively. Accordingly, the level of the voltage VSUM1 may decrease.

Because the voltages VSUM1 to VSUMn are generated based on data output from memory cells of the memory cell array 1200, each of the voltages VSUM1 to VSUMn may have a level corresponding to a specific logical value (e.g., logical value "1" or logical value "−1"). According to the above operations of the amplifiers 1321 to 132n, a voltage having a level of logical value "1" may be amplified positively, and a voltage having a level of logical value "−1" may be amplified negatively. Accordingly, a difference between the level corresponding to logical value "1" and the level corresponding to logical value "−1" may increase. This may mean that any other electronic circuits following the sense amplifier block 1300 clearly determine logical values of the signals OUT1 to OUTn.

Figure 10:
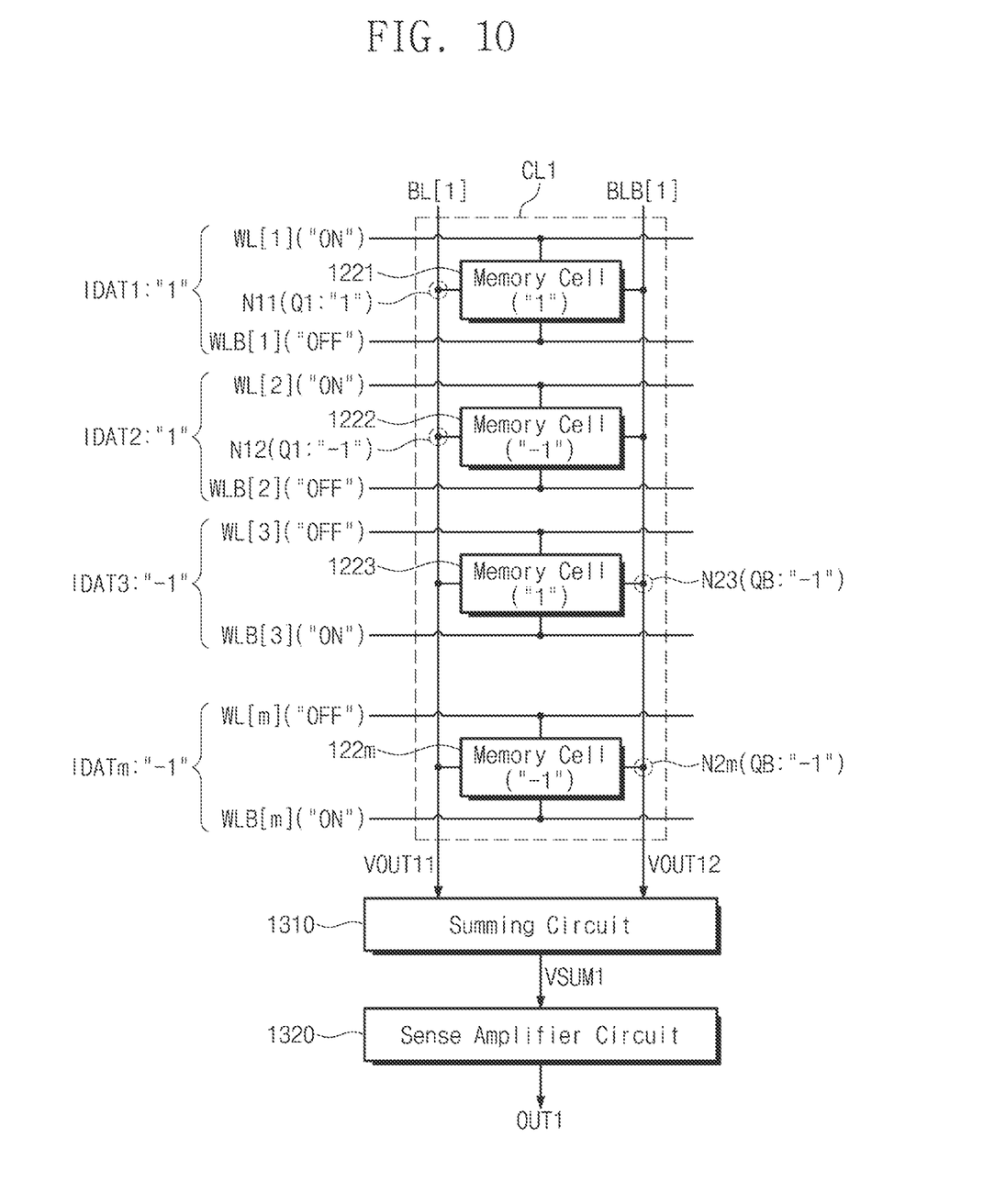
FIG. 10 is a conceptual diagram illustrating exemplary operations of memory cells included in a column of FIG. 2.

FIG. 10 is a conceptual diagram illustrating exemplary operations of memory cells included in a column of FIG. 2.

As training is performed on the electronic device 1000, the memory cells 1221 to 122m of the column CL1 may store weights, respectively. For example, the memory cell 1221 may store weight "1", the memory cell 1222 may store weight "−1", the memory cell 1223 may store weight "1", and the memory cell 122m may store weight "−1".

For example, as a voltage for turning on a transistor is received through the word line WL[1] and a voltage for turning off a transistor is received through the word line WLB[1], data of logical value "1" may be input to the memory cell 1221. The memory cell 1221 may perform operations similar to the operations described with reference to FIG. 4 and may output the data "Q" of logical value "1" through a node N11.

For example, as the voltage for turning on a transistor is received through the word line WL[2] and the voltage for turning off a transistor is received through the word line WLB[2], data of logical value "1" may be input to the memory cell 1222. The memory cell 1222 may perform operations similar to the operations described with reference to FIG. 5 and may output the data "Q" of logical value "−1" through a node N12.

For example, as the voltage for turning off a transistor is received through the word line WL[3] and the voltage for turning on a transistor is received through the word line WLB[3], data of logical value "−1" may be input to the memory cell 1223. The memory cell 1223 may perform operations similar to the operations described with reference to FIG. 6 and may output the data QB of logical value "−1" through a node N23.

For example, as the voltage for turning off a transistor is received through the word line WL[m] and the voltage for turning on a transistor is received through the word line WLB[m], data of logical value "−1" may be input to the memory cell 122m. The memory cell 122m may perform operations similar to the operations described with reference to FIG. 7 and may output the data QB of logical value "−1" through a node N2m.

The voltage VOUT11 may be output through the bit line BL[1], based on data output from memory cells (e.g., the memory cells 1221 and 1222) receiving data of logical value "1" from among memory cells. Accordingly, a level of the voltage VOUT11 may correspond to a sum of data output through the bit line BL[1].

The voltage VOUT12 may be output through the bit line BLB[1], based on data output from memory cells (e.g., the memory cells 1223 and 122m) receiving data of logical value "−1" from among the memory cells. Accordingly, a level of the voltage VOUT12 may correspond to a sum of data output through the bit line BLB[1].

As described with reference to FIGS. 8 and 9, the summing circuit 1310 may output the voltage VSUM1 having a level corresponding to a sum of the levels of the voltages VOUT11 and VOUT12. The sense amplifier circuit 1320 may amplify the level of the voltage VSUM1 to output the signal OUT1.

Figure 11:
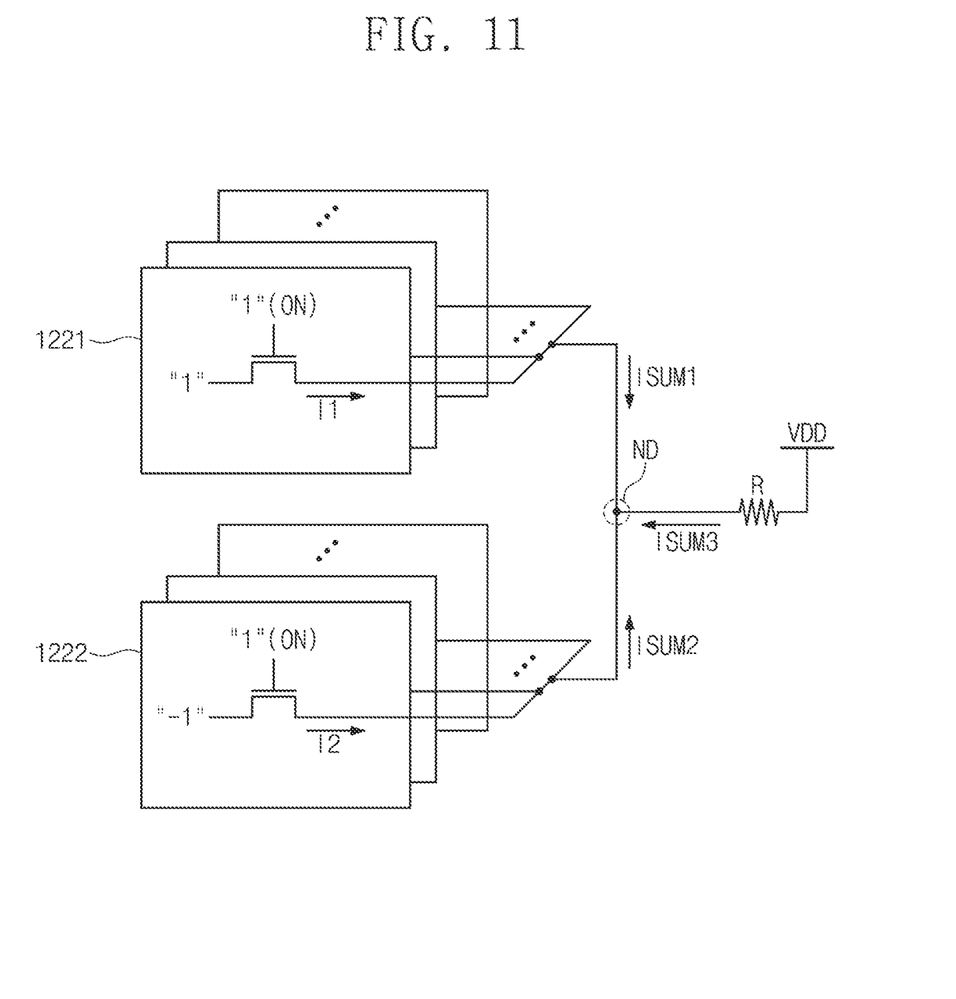
FIG. 11 is a conceptual diagram illustrating exemplary operations of memory cells included in a column of FIG. 2.

FIG. 11 is a conceptual diagram illustrating exemplary operations of memory cells included in a column of FIG. 2.

In the example of FIG. 11, data of logical value "1" may be input to memory cells (e.g., the memory cell 1221). Each of the memory cells may output data having a logical value corresponding to weight "1" through a bit line in response to the input data. For example, through a transistor turned on in response to logical value "1", currents (e.g., a current I1) of a level corresponding to logical value "1" may be output through the bit line.

Accordingly, a sum of currents (i.e., currents corresponding to logical value "1") output from the memory cells may be output to the node N11 as a current ISUM1. For example, in the case where the number of memory cells to which data of logical value "1" are input is "P", a level of the current ISUM1 may be "P" times the level I1 of the current I1 (i.e., "P*I1"). Because levels of currents output from memory cells respectively correspond to logical values of data output from the memory cells, a level of the current ISUM1 may correspond to a sum of data output from the memory cells.

In the example of FIG. 11, data of logical value "−1" may be input to memory cells (e.g., the memory cell 1222). Each of the memory cells may output data having a logical value corresponding to weight "−1" through a bit line in response to the input data. For example, through a transistor turned on in response to logical value "1", currents (e.g., a current I2) of a level corresponding to logical value "−1" may be output through the bit line.

Accordingly, a sum of currents (i.e., currents corresponding to logical value "−1") output from the memory cells may be output to the node N11 as a current ISUM2. For example, in the case where the number of memory cells to which data of logical value "−1" are input is "L", a level of the current ISUM2 may be "L" times the level I2 of the current I2 (i.e., "L*I2"). Because levels of currents output from memory cells respectively correspond to logical values of data output from the memory cells, a level of the current ISUM2 may correspond to a sum of data output from the memory cells.

As the currents ISUM1 and ISUM2 flow, a current ISUM3 may flow from the supply terminal of the operating voltage VDD through the resistor "R". A level of the current ISUM3 may correspond to a sum of the levels of the currents ISUM1 and ISUM2. Because the levels of the currents ISUM1 and ISUM2 correspond to a sum of data output from memory cells of the column CL1, the level of the current ISUM3 may correspond to the sum of the data output from the memory cells of the column CL1.

The voltage VSUM1 may be formed at the node N11 by the currents ISUM1, ISUM2, and ISUM3. For example, when the current ISUM1 has a positive level and the current ISUM2 has a negative level, a level of the voltage VSUM1 may be pulled up and pulled down by the currents ISUM1, ISUM2, and ISUM3. Accordingly, the level of the voltage VSUM1 may correspond to a sum of data output from memory cells.

Figure 12:
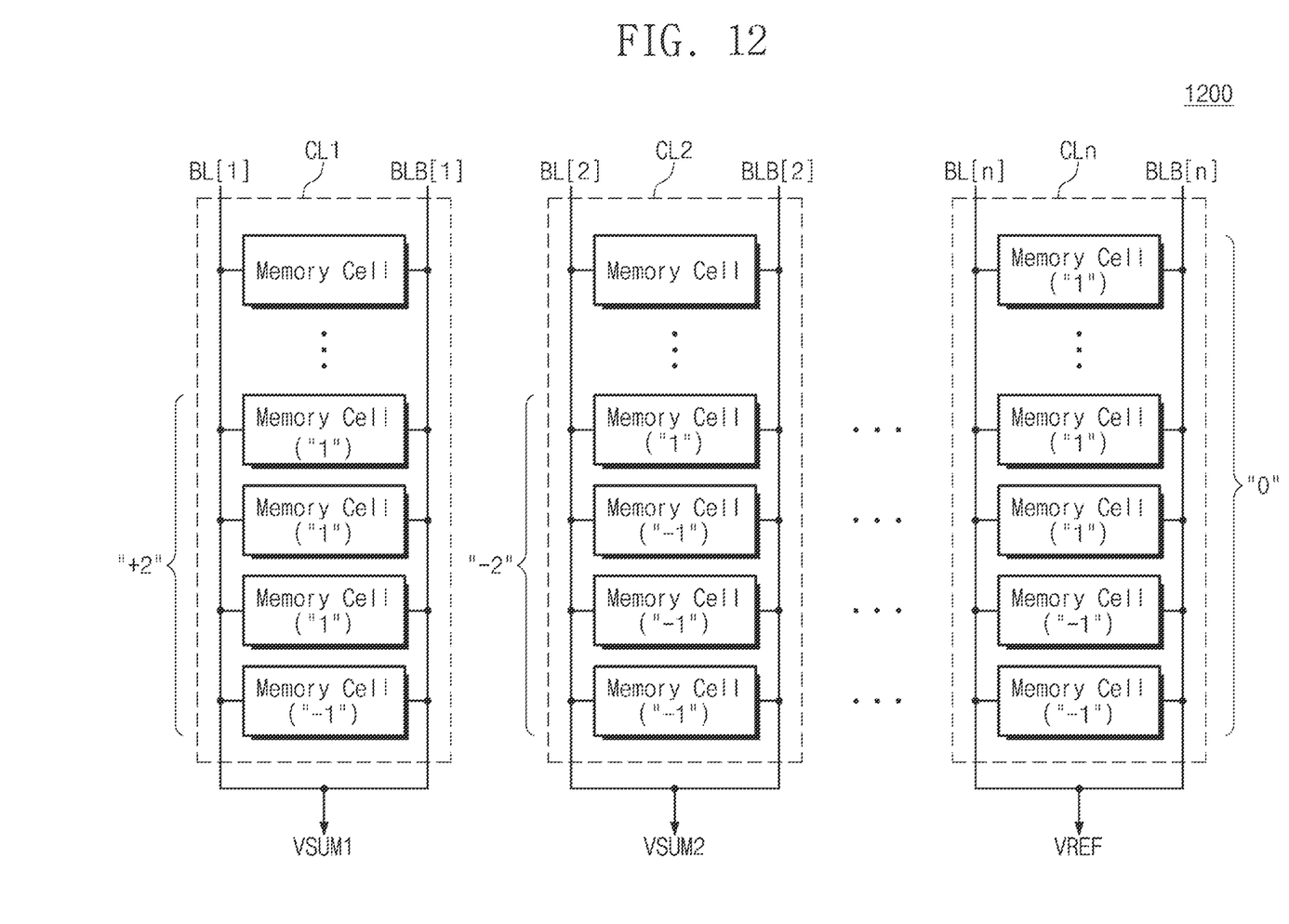
FIG. 12 is a conceptual diagram illustrating memory cells of FIG. 2, which store exemplary data for in-memory calibration.

FIG. 12 is a conceptual diagram illustrating memory cells of FIG. 2, which store exemplary data for in-memory calibration and generation of a reference voltage.

For example, a level of a voltage output from the memory cell array 1200 may be biased due to influence of a noise inherent in the memory cell array 1200. In this case, a noise may be included in a signal output from the electronic device 1000. The electronic device 1000 may be designed such that the in-memory calibration for removing the influence of the noise is performed.

For example, the designer may measure a deterministic noise inherent in the memory cell array 1200 through various kinds of test operations for the memory cell array 1200. Data required for the in-memory calibration and memory cells for storing the data may be determined based on the measured noise. For example, the number of memory cells in which data required for the in-memory calibration are to be stored may be determined.

For example, in the column CL1, weight "1" may be stored in three memory cells, and weight "−1" may be stored in one memory cell. Afterwards, fixed data may be input to the four memory cells for the in-memory calibration through word lines. Accordingly, a level of the voltage VSUM1 may include an offset corresponding to a sum (i.e., "+2") of data output from the four memory cells.

For example, in the column CL2, weight "−1" may be stored in three memory cells, and weight "1" may be stored in one memory cell. Afterwards, fixed data may be input to the four memory cells for the in-memory calibration through word lines. Accordingly, a level of the voltage VSUM2 may include an offset corresponding to a sum (i.e., "−2") of data output from the four memory cells.

Accordingly, with regard to a specific column, the number of memory cells storing weight "1" and the number of memory cells storing weight "−1" may be associated with an offset of a voltage output from the specific column. For example, as the number of memory cells storing weight "1" increases, an offset of a voltage being output may increase; as the number of memory cells storing weight "−1" increases, an offset of a voltage being output may decrease.

In the example of FIG. 12, the column CLn may be designed to generate the reference voltage VREF. For example, the column CLn may be designed such that a half of memory cells included therein stores data of logical value "1" and the others thereof store data of logical value "−1". Because the number of memory cells storing weight "1" is equal to the number of memory cells storing weight "−1", the reference voltage VREF having a level corresponding to reference value "0" may be output from the column CLn. The reference voltage VREF having a level corresponding to reference value "0" is described with reference to FIG. 12, but it may be understood that a level of the reference voltage VREF is variously changed.

Figure 13:
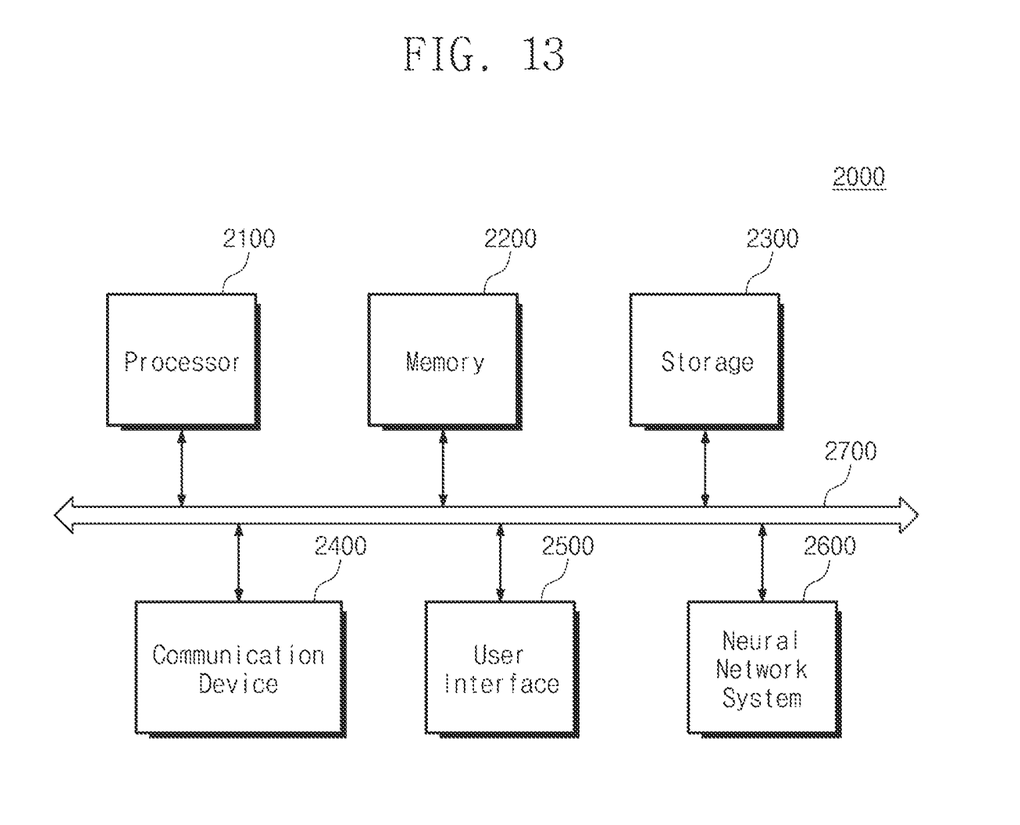
FIG. 13 is a block diagram illustrating an exemplary electronic device including an electronic device of FIG. 1.

FIG. 13 is a block diagram illustrating an exemplary electronic device including an electronic device of FIG. 1.

FIG. 13 is a block diagram illustrating an exemplary electronic device including a neural network system according to an embodiment of the inventive concept.

An electronic device 2000 may include the electronic device 1000 of FIG. 1. For example, the electronic device 2000 may be one of a personal computer, a workstation, a notebook computer, a mobile device, etc. Referring to FIG. 13, the electronic device 2000 may include a processor 2100, a memory 2200, storage 2300, a communication device 2400, a user interface 2500, a neural network system 2600, and a bus 2700.

The electronic device 2000 may further include any other components (e.g., various sensors and a power supply) that are not illustrated in FIG. 13. Alternatively, the electronic device 2000 may not include one or more of the components illustrated in FIG. 13.

The processor 2100 may control overall operations of the electronic device 2000. The processor 2100 that is a central control device may process operations necessary for an operation of the electronic device 2000. For example, the processor 2100 may process data for controlling operations of the electronic device 2000.

For example, the processor 2100 may be one of a general-purpose processor, a workstation processor, an application processor, etc. The processor 2100 may include one processor core (i.e., a single core) or may include a plurality of processor cores (i.e., a multi-core). For example, the processor 2100 may include a multi-core such as a dual-core, a quad-core, a hexa-core, or the like.

The processor 2100 may include the processor 10 of FIG. 1. The processor 10 may generate input data for training of the neural network system 2600. Alternatively, the processor 2100 may generate input data corresponding to a question input by the user. The processor 2100 may output a command for obtaining result data corresponding to the question.

The memory 2200 may store data processed or to be processed by the processor 2100. For example, the memory 2200 may include a volatile memory such as a static random access memory (SRAM), a dynamic RAM (DRAM), a synchronous DRAM (SDRAM), etc. or a nonvolatile memory such as a flash memory, a phase-change RAM (PRAM), a magneto-resistive RAM (MRAM), a resistive RAM (ReRAM), a ferroelectric RAM (FRAM), etc. Alternatively, the memory 2200 may include heterogeneous memories.

The storage 2300 may store data regardless of whether a power is supplied. For example, the storage 2300 may be a storage medium, which includes a nonvolatile memory, such as a hard disk drive (HDD), a solid state drive (SSD), a secure digital (SD) card, a universal serial bus (USB) memory device, or the like.

The communication device 2400 may include a transmission unit and a reception unit. The electronic device 2000 may communicate with another electronic device through the communication device 2400 to transmit and/or receive data. The user interface 2500 may provide an input/output of an instruction or data between the user and the electronic device 2000. For example, the user interface 2500 may include a physical device such as an input device and/or an output device. The input device may include a keyboard, a mouse, a touchscreen, a scanner, a joystick, a voice recognition device, a motion recognition device, or an eyeball recognition device, and the output device may include a monitor, a display device, a projector, a speaker, or a plotter.

For example, the user may input a command through the user interface 2500 for the purpose of obtaining an answer to a question. The user interface 2500 may provide the user with information about the answer corresponding to the question.

The neural network system 2600 may include the electronic device 1000 of FIG. 1. Alternatively, the neural network system 2600 may include the processor 10 and the electronic device 1000 of FIG. 1. As described with reference to FIG. 1, the neural network system 2600 may operate based on a command CMD received from the processor 2100.

The bus 2700 may provide a communication path between the components of the electronic device 2000. For example, the processor 2100, the memory 2200, the storage 2300, the communication device 2400, the user interface 2500, and the neural network system 2600 may exchange data with each other through the bus 2700. The bus 2700 may be configured to support various communication formats used in the electronic device 2000.

According to an embodiment of the inventive concept, an algorithm based on a neural network may be efficiently implemented.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An electronic device comprising:
a first column including:
a first memory cell configured to output first result data of a logical value determined according to a logical operation through a first bit line or a second bit line, based on first input data input through a first word line and a first weight, including a first transistor configured to receive a first voltage through the first word line and connected between a first node and the first bit line and a second transistor configured to receive a second voltage through a second word line and connected between a second node and the second bit line, and
a second memory cell configured to output second result data of a logical value determined according to the logical operation through the first bit line or the second bit line, based on second input data input through a third word line and a second weight, including a third transistor configured to receive a third voltage through the third word line and connected between a third node and the first bit line and a fourth transistor configured to receive a fourth voltage through a fourth word line and connected between a fourth node and the second bit line; and
an amplification circuit configured to output a sum of the first result data and the second result data.

2. The electronic device of claim 1,
wherein the first to fourth transistors are turned-on in response to the first to fourth voltage having a first logical value, respectively, and are turned-off in response to the first to fourth voltage having a second logical value, respectively, and wherein a logical value of the first input data is same as a logical value of the first voltage and a logical value of the second input data is same as a logical value of the third voltage, and wherein the second logical value is complementary to the first logical value.

3. The electronic device of claim 1, wherein the first to fourth transistors are NMOS transistors.

4. The electronic device of claim 1, wherein the first memory cell further includes a first inverter configured to invert a first logical value of data on the first node and latch the inverted first logical value on the second node and a second inverter configured to invert a second logical value of data on the second node and latch the inverted second logical value on the first node; and wherein the second memory cell further includes a third inverter configured to invert a third logical value of data on the third node and latch the inverted third logical value on the fourth node and a fourth inverter configured to invert a fourth logical value of data on the fourth node and latch the inverted fourth logical value on the third node.

5. The electronic device of claim 4, wherein the first memory cell further stores the first weight through a latch operation of the first inverter and the second inverter, and wherein the second memory cell further stores the second weight through a latch operation of the third and the fourth inverter.

6. The electronic device of claim 1, wherein the first memory cell is further configured to:

output the first result data having a logical value corresponding to the first weight through the first bit line in response to a first logical value of the first input data; and output the first result data having a logical value complementary to the first weight through the second bit line in response to a second logical value of the first input data.

7. The electronic device of claim 1, wherein the amplification circuit is further configured to:

generate an output voltage having a level corresponding to a sum of the first result data and the second result data; and output data based on a result of comparing the level of the output voltage and a level of a reference voltage.

8. The electronic device of claim 7, further comprising:

a second column including memory cells for storing data of a given logical value and memory cells for storing data of another logical value, wherein a number of the memory cells for storing the data of the given logical value is equal to a number of the memory cells for storing the data of the another logical value.

9. The electronic device of claim 8, wherein the reference voltage is output from a second column based on voltages received through the first word line and the third word line.

10. The electronic device of claim 1, wherein the first column further includes:

memory cells for storing data of a first logical value and memory cells for storing data of a second logical value.

11. The electronic device of claim 10, wherein a number of the memory cells for storing the data of the first logical value and a number of the memory cells for storing the data of the second logical value are associated with a noise generated by memory cells of the first column.

12. The electronic device of claim 11, wherein the number of the memory cells for storing the data of the first logical value and the number of the memory cells for storing the data of the second logical value are associated with an offset corresponding to the sum of the first result data and the second result data.

13. The electronic device of claim 1, wherein the logical operation includes an XNOR operation.

* * * * *